United States Patent
Van Campenhout et al.

(10) Patent No.: US 6,251,703 B1
(45) Date of Patent: Jun. 26, 2001

(54) CMS COATED MICROELECTRONIC COMPONENT AND ITS METHOD OF MANUFACTURE

(75) Inventors: Yves Van Campenhout, Villeneuve-Saint-Georges; Dominique Gilet, Antony; Thierry Legay, Fontenay-les-Briis; Hubert Bono, Haute-Jarrie, all of (FR)

(73) Assignee: Ela Medical S.A., Montrouge (FR)

(*) Notice: Subject to any disclaimer, the term of this patent is extended or adjusted under 35 U.S.C. 154(b) by 0 days.

(21) Appl. No.: 09/459,272

(22) Filed: Dec. 13, 1999

(30) Foreign Application Priority Data

Dec. 14, 1998 (FR) .................................................. 98 15759

(51) Int. Cl.[7] .......................... H01L 21/44; H01L 21/48; H01L 21/50
(52) U.S. Cl. ........................ 438/106; 438/110; 438/113; 438/114; 438/127
(58) Field of Search .................................. 438/106, 110, 438/113, 114, 127

(56) References Cited

U.S. PATENT DOCUMENTS

| | | | |
|---|---|---|---|
| 4,613,891 | 9/1986 | Ng et al. | 357/68 |
| 5,554,887 | * 9/1996 | Sawai et al. | |
| 5,714,800 | * 2/1998 | Thompson | |
| 5,858,815 | 1/1999 | Heo et al. | 438/112 |
| 5,926,380 | 7/1999 | Kim | 361/813 |
| 6,057,597 | * 5/2000 | Farnworth et al. | |
| 6,109,369 | * 8/2000 | Crumly et al. | |

FOREIGN PATENT DOCUMENTS

| | | | |
|---|---|---|---|
| 10012765 | 1/1998 | (JP) | H01L/23/12 |
| WO 98/33211 | 1/1997 | (WO) | H01L/21/60 |

OTHER PUBLICATIONS

XP–002113822 Val C.M: "New Chip Scale Package for Medical Applications: "Plip–Chip"" Proceedings 1996 International Symposium on Microelectronics, pp. 236–242.

* cited by examiner

Primary Examiner—John F. Niebling
Assistant Examiner—Josetta I. Jones
(74) Attorney, Agent, or Firm—Orrick, Herrington & Sutcliffe LLP

(57) ABSTRACT

A microelectronic coated CMS component, in particular for an active implantable medical device, and its method of manufacture. The process is applied to a wafer from which will be formed, after cutting, a plurality of CMS components of the CSP type, i.e., having appreciably the same dimensions as those of the chip. The process includes (a) obtaining a wafer (10) on which are formed the chips (12), each chip having a contact pad (16) on at least one side of the chip; (b) sealing on this wafer a cap (18) having openings (20) authorizing an access to the subjacent contact pads of the chips; (c) forming in the cap distinct trenches (22) according to the periphery of each chip; (d) establishing in the openings an electrical connection to the contact pads, these connections (26) emerging through the upper face of the cap; (e) flowing a coating resin (34) into the openings and the trenches; (f) polishing and metallizing the cap; and (g) cutting the wafer thus prepared into individual components.

15 Claims, 1 Drawing Sheet

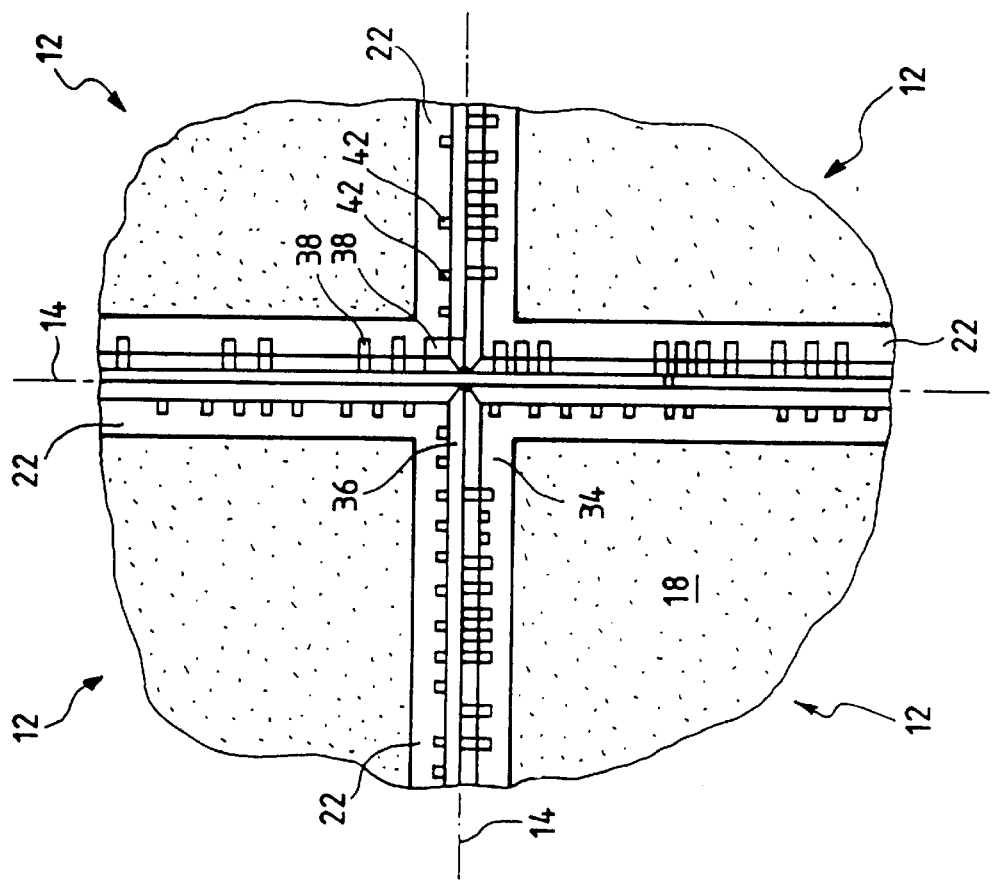
FIG_3
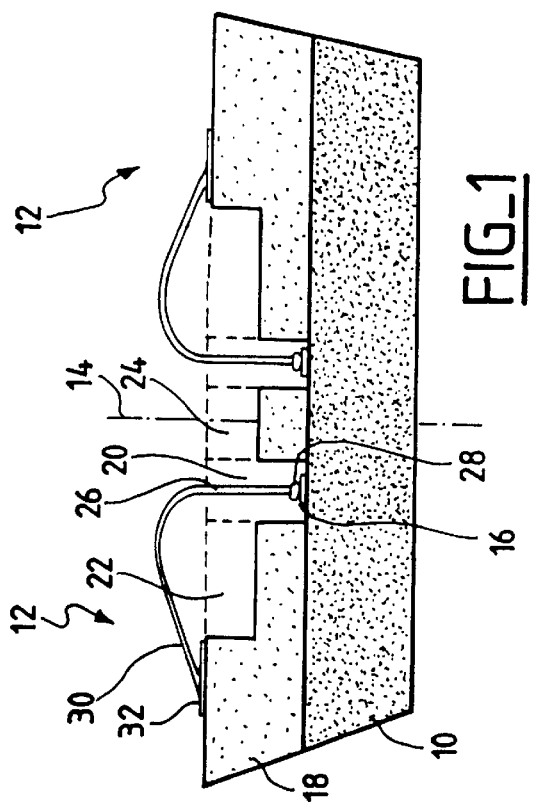
FIG_1
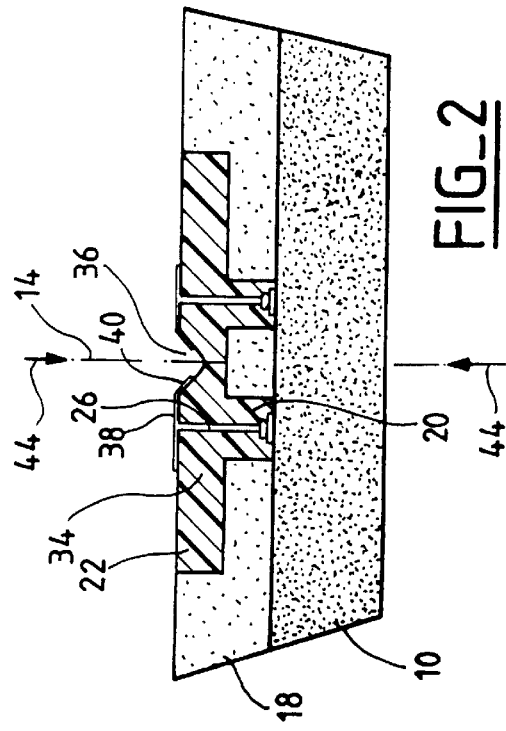
FIG_2

CM S COATED MICROELECTRONIC COMPONENT AND ITS METHOD OF MANUFACTURE

FIELD OF THE INVENTION

The present invention relates to micro-electronic circuit technology, more particularly to the technology known as Chip Scale Packaging ("CSP") in which the final component extends over a surface which does not exceed the size of the integrated circuit chip. In other words, the coating over the chip does not increase the surface area occupied by the component on the substrate that will receive it. CSP technology is particularly advantageous in the fields where the miniaturization of the circuits is an essential parameter, such as in pacemaker circuits and other active implantable medical devices.

BACKGROUND OF THE INVENTION

CSP techniques are known. One technique is described in WO-A-93/24956, whose applicant is a co-assignee of the present invention, and which reference describes a method of manufacture of a component in which the face of the chip is completely covered with a layer of a resin coating and carries a series of metalizations connected to the contact pads of the chip, these pads beings embedded in the resin layer. The technique described in this document makes it possible to obtain a collective coating which is applied to the semiconductor wafer before the wafer is cut into chips, which technique minimizes the unit cost applied to each chip. However, in this technique, the resin coating covers the entirety of the wafer, which can generate two types of difficulties. First, the wafers produced today are increasing in size, the diameters of which have evolved from 4, 5, 6, 8 and up to 12 inches, and the total constraint generated on the wafer by the hardening of the resin, which is very hard once polymerized, can stress this wafer, and even cause cracks, breaks or cleavages. Second, the resin is in contact with the active part of the electronic circuits etched or formed on the various chips and can, in the long run, allow ionic contamination or various chemical pollutants permeate through the resin. Indeed, unlike the "chip carrier technologies", wherein the chip is completely insulated in a sealed case filled with a neutral gas such as nitrogen, the resin constitutes only an impediment, not a barrier, to the aggressions of the external medium, and consequently can reduce the long-term reliability of the electronic micropattern, which is not completely isolated.

OBJECT AND SUMMARY OF THE INVENTION

It is an object of the present invention to propose a method for realization of a component in CSP technology, making it possible to cure the aforementioned disadvantages. The process remains a collective process, applicable to the wafer before the wafer is cut into chips, so as to preserve a competitive manufacturing cost.

The process of the invention is of the general type indicated above, namely a collective process applied to a wafer carrying a plurality of individual chips formed therein, and from which will be formed, after the wafer is cut, a corresponding plurality of components, the resulting components each being a "CMS" component of the CSP type, having a surface with dimensions extending a length and a width that is appreciably the same dimensions as the dimensions of the chip that it incorporates.

According to the invention, one embodiment of the process is characterized by the steps of:

(a) obtaining a wafer on which the aforementioned plurality of individual chips are formed, e.g., etched, with, for each chip, a series of contact pads laid out on at least one of the sides of the chip;

(b) sealing on this wafer, in predetermined areas of each component, a cap, the cap comprising an opening for each pad of the subjacent chips, these openings being through-holes authorizing an access to the corresponding pads;

(c) forming in the cap, in a fraction of its thickness, of trenches following the sides, or respectively the peripheries, of each subjacent chip, with the various openings all emerging in a trench;

(d) establishing electrically conducting connections to the pads through the openings, these electrical connections emerging from the top face of the cap;

(e) flowing a resin coating into the openings and the trenches;

(f) polishing and metalizing the cap; and (g) cutting the wafer into individual components.

In a preferred embodiment, the cap is a wafer that is comparable in nature to and of the same dimensions as the wafer on which the chips are etched, more particularly a silicon wafer. The phrase "comparable in nature" is used to mean a material having substantially the same coefficient of expansion and contraction and rigidity.

The sealing step (b) is preferably performed by depositing or engraving an adhesive strip along the periphery of each chip, and possibly, also depositing an adhesive material into the central area of each chip, to provide that the cap is securely affixed to each chip when the wafer is cut.

In one embodiment, installing the electrically conducting connections at step (d) is obtained by welding or soldering (collectively "welding") metal wire onto the pads through the openings, and/or forming metal conductors by deposition and etching of a metalization in contact with the pads, and extending the contact over the sides and out from the openings, and from the bottom and the sides of the trenches, such that the metalization is electrically isolated from the wafer and the cap. Alternatively, the conducting electric connections installed at step (d) emerge at the surface of the cap in the form of contacts distributed in the periphery of the component, and/or points of a pattern for interconnection leading to contacts distributed in the central area of the component.

It should be understood, however, that the invention also is directed to a CMS (also known as surface mount technology "SMT") component of the generic type having a chip comprising an external coating allowing its connection to a substrate, this coating bearing on its surface a plurality of external metallizations electrically connected, through the coating material, to the pads of the chip, the component being a component of the CSP type having, in the length and width dimensions, appreciably the same dimensions as those of the chip before coating.

According to this aspect of the invention, this component is characterized in that the chip is covered on its surface with a cap sealed to the chip in predetermined areas, this cap comprising openings over each subjacent contact pad, these openings being through-holes authorizing an access to the corresponding pads, and also comprising a network trench formed in a fraction of the cap thickness along at least one of the sides of the component carrying the pads, the various openings all emerging in a trench, and in that the resin coating is formed on the cap and on a reduced thickness of the surface, essentially in the region of the trench.

The cap can be in particular a wafer comparable in nature to, and of the same dimensions as, the wafer on which the chips are etched, in particular a silicon wafer. In addition, the cap can be sealed by an adhesive strip defining in the periphery of each chip, and possibly, also an adhesive deposited in the central area of each chip.

BRIEF DESCRIPTION OF THE DRAWINGS

Further characteristics, benefits, and advantages of the present invention will become more apparent from the accompanying drawings, in which like reference characters refer to like elements, and in which:

FIGS. 1 and 2 are partial cross-sections of the coated wafer, respectively illustrating an intermediate stage of the process and the final result obtained in accordance with a preferred embodiment of the present invention; and FIG. 3. is a top plan view of the coated wafer obtained by the process of the present invention, prior to cutting the wafer into individual chip components.

DETAILED DESCRIPTION OF THE INVENTION

Referring to FIGS. 1–3, reference 10 indicates a semi-conductor wafer, for example, a wafer made of silicon, which one can designate as "active wafer", bearing a certain number of electronic micro-patterns formed therein, which are intended to form individual components 12 after separation along cutting lines 14. Each component 12 comprises a chip equipped with a plurality of contact pads 16, which are a metallized area leveling a surface area of wafer 10.

Essentially, the invention proposes to carry out a physical encapsulation of the active wafer 10 by sealing a wafer 18, also referred to a "cap", on the active wafer 10. The cap or wafer 18 can be, for example, but not in a limiting manner, a silicon wafer, constituting a "passive wafer".

To give access to the contact pads 16, cap 18 is engraved or etched deeply, right through its thickness, into area 20, in order to obtain openings opposite to pads 16 and to allow a connection to the pads. To insulate the active wafer 10 completely from the surrounding medium, and to protect it from possible chemical contamination, electronic connections to the contact pads 16 will be then glued or otherwise fixed in an insulating resin, under an inert atmosphere, in a manner that will be described below in greater detail.

In a preferred embodiment, the first step of the process involves microphotolithographing a cap 18 in order to create therein, on the one hand, openings 20 and, on the other hand, a peripheral trench 22 containing all of the openings 20, that trench being formed only partway through the thickness of cap 18 and along one or more sides of each component 12, forming a network of trenches 22 with respect to the wafer. The contact pads 16 can be located on one or more sides of component 12, thus giving the wafer a squaring or grid-like pattern, as illustrated, for example, in FIG. 3.

It should be noted that trenches 22 of adjacent components 12 are, as illustrated on the FIGS. 1–3, joined in the area 24, so as to allow, as it will be described further, a good flow of the resin into and along these trenches.

Thus microphotolithographed (the microphotolithogrpaphy step being preferably a first step), cap 18 is then sealed on the active wafer 10. This sealing can be carried out by an adhesive, for example, a photosensitive adhesive, applied as a peripheral strip around the circumference of each chip. The adhesive also may be deposited elsewhere in the periphery, for example, in a crosshatched pattern on the central part of the chip if it is desired to increase adherence. The adhesive selected, of course, is preferably an adhesive compatible with the material of wafer 10 (e.g., silicon) in order to avoid any creation of constraints at the wafer/cap interface during any thermal cycle. The cap is typically not in close contact with the chip, except at the place of the adhesive strip. Further, the sealing operation is practiced under an inert atmosphere, for example, of nitrogen, to protect the electronic micropattern from potential chemical contamination.

Of course, the sealing of cap 18 on active wafer 10 is operated by respecting a precise positioning such that the contact pads 16 are all exposed to an opening 20, thus giving access to the pads through cap 18. To allow for this precise positioning, in particular, the same mask can be used for the realization of wafer 10 and cap 18, for example, to use the passivation mask of wafer 10 as an etching mask for the openings 20 in cap 18.

After sealing, the next operation is to provide an electrical connection from contact pads 16 through openings 20. A first technique which can be used, and which corresponds to the illustrated example, is that described in the above-mentioned WO-A-93/24956. This technique involves connecting a wire 26 passing through opening 20, at one end to the contact pads 16 by a fusible ball 28, the wire 26 being finished at the other end by a tail 30 which is temporarily welded onto a metalization area 32 provided for this purpose on the upper surface of cap 18, after having carried out loops which will be thereafter removed, as further explained below. The terms welded and soldered are used interchangeably herein.

Another technique of creating the contact on the active chip is to use the well-known technique of depositing and etching, and thus laying metalization on the sides of openings 20 and the trenches 22. If one uses for cap 18 a conducting material such as silicon, it is necessary to isolate the cap from the metalization on the sides, for example, by depositing or forming a suitable passivisation layer. Once the creation of the contact operation has been carried out, the structure presents the configuration illustrated on FIG. 1.

The next step concerns providing a coating resin 34 to flow into openings 20 and trenches 22, this resin 34 being flowed according to the direction of the trenches so that the resin fills openings 20 and glues the interconnection wire 26 in place. The resin flowed into the trenches is preferably a polymerizable material, such as a polyamide, an epoxy polymer, etc., which is likely to be run locally and to be hardened in situ, for example, by exposure to ultraviolet rays or elevated temperature. After polymerization, the hardened material, although rigid, has nevertheless sufficient flexibility, in particular, because of the small thickness on which it is deposited into the trench, to generate only a minimal constraint that is not susceptible to buckle wafer 10.

Incidentally, it should be understood that the term "coating", which could be used in the present description should not be interpreted in a restrictive sense as suggesting a complete envelopment of the chip. Rather, this term refers only to a particular technology wherein the resin can be applied, like here, only locally, at the periphery of the component.

The structure comprising wafer 10 and cap 18 is then polished in order to remove the excess resin and the portions of wire exceeding the upper level of the trench. Resin 34 thus levels the upper surface of cap 18, with the end of wire 26 emerging on the surface of the resin.

It is quite possible to realize in resin 34, for example, by grinding a hollow 36 intended to form later on the edge of component 12 a bevel, allowing in a well-known manner the visual monitoring of the welding when this component is assembled on its substrate host.

The upper face of the cap is then metallized, then etched to extend a conductive trace from contact pads 38 which will allow the interconnection of the obtained final SMT component. If a hollow 36 is formed, the pads 38 can overflow into sides 40 in the hollow in order to allow a better spreading out of the weld or solder at the time the component is assembled on its substrate host.

Referring to the plan view of FIG. 3, the various emerging metallizations are shown, with the metalization 38 formed on the resin on the cap surface, as well as points 42 in contact with conductors connected to the chip pads 16. These points 42, which are not extended outside by a metalization, can, for example, be used to operate a test of the wafer, before cutting the wafer into individual components, which test can be operated before as well as after coating of the wafer.

In alternative to what is illustrated in FIG. 3, one will note that metalization 38 (support contacts on the substrate host) are distributed in the periphery of the component. This characteristic is, however, not restrictive, and it is possible, for example, to have support contacts distributed on the surface of the cap, while envisaging a redirectionning between, on the one hand, the emerging parts of conductors 26 located in periphery of the component, and, on the other hand, support contacts located in the central area of the cap, which are generally of a greater dimension.

In the latter example, it is possible to deposit fusible metal balls on the support contacts, which will make it possible to weld the component onto its substrate host without a welding support. This technique is known as Ball Grid Array ("BGA") which allows, in the case of a significant number of contacts, to distribute the contacts according to a grid whose step, i.e., line dimension, for example, is 0.8 $\mu$m, which is notably larger than the step of the contact pads of the chip, typically of 0.2 $\mu$m, thus avoiding the problems involved with contact pads that are too close together.

Lastly, the coated wafer is cut into individual components (according to line 44 of FIG. 2), so as to obtain individual CSP components 12 in the shape of mountable chips coated on a substrate in the manner of a CMS component, the bevel on the lower edge, coming from the realization of hollow 36, allowing the visual monitoring of the welding on the substrate host.

One skilled in the art will appreciate that the present invention can be practiced by other than the foregoing embodiments, which are presented for purposes of illustration and not of limitation.

What is claimed is:

1. A process for producing coated components including electronic chips, from a wafer carrying a plurality of individual chips and from which will be formed, after cutting of the wafer, a corresponding plurality of components, the components being a CMS component of the CSP type, comprising:
   (a) providing a wafer on which is formed a plurality of individual chips, each chip having at least one side and comprising a plurality of contact pads, said pads being laid out on at least one side of the chip;
   (b) sealing a cap to said wafer in predetermined areas of each chip, the cap having a thickness, an upper face, and a plurality of openings corresponding to said contact pads of said chips subjacent the cap, these openings being through-holes positioned to allow access to the corresponding contact pads;
   (c) forming in the cap, on a portion of the cap thickness, a plurality of trenches along each subjacent chip, such that the plurality of openings emerges into said trenches;
   (d) providing in the plurality of openings electrical connections conducting at the pads, said connections emerging on the upper face of the cap;
   (e) flowing a coating resin into said plurality of openings and trenches;
   (f) polishing and metallising the cap, and
   (g) cutting the wafer into a plurality of individual coated components.

2. The process of claim 1, wherein step (d) further comprises installing a metal wire through at least one of said openings onto the corresponding contact pad.

3. The process of claim 1, wherein step (d) further comprises passing the electrical conducting connections through the surface of the cap and extending said connections to a periphery of the cap.

4. The process of claim 1, wherein step (d) further comprises passing said electrical conducting connections installed through the surface of the cap in points of an interconnection pattern leading to contacts distributed in a central area of the cap.

5. A process for producing coated components including electronic chips, from a wafer carrying a plurality of individual chips and from which will be formed, after cutting of the wafer, a corresponding plurality of components, the components being a CMS component of the CSP type, comprising:
   (a) providing a wafer on which is formed a plurality of individual chips, each chip having at least one side and comprising a plurality of contact pads, said pads being laid out on at least one side of the chip;
   (b) sealing a cap to said wafer in predetermined areas of each chip, wherein the cap comprises a wafer having chemical properties and dimensions comparable to the wafer bearing said chips, the cap having a thickness, an upper face, and a plurality of openings corresponding to said contact pads of said chips subjacent the cap, these openings being through-holes positioned to allow access to the corresponding contact pads;
   (c) forming in the cap, on a portion of the cap thickness, a plurality of trenches along each subjacent chip, such that the plurality of openings emerges into said trenches;
   (d) providing in the plurality of openings electrical connections conducting at the pads, said connections emerging on the upper face of the cap;
   (e) flowing a coating resin into said plurality of openings and trenches;
   (f) polishing and metallising the cap, and
   (g) cutting the wafer into a plurality of individual coated components.

6. The process of claim 5 wherein providing the cap and wafer of the same chemical properties and dimensions further comprises providing the cap and wafer as silicon wafers.

7. A process for producing coated components including electronic chips, from a wafer carrying a plurality of individual chips and from which will be formed, after cutting of the wafer, a corresponding plurality of components, the components being a CMS component of the CSP type, comprising:
   (a) providing a wafer on which is formed a plurality of individual chips, each chip having at least one side and comprising a plurality of contact pads, said pads being laid out on at least one side of the chip;
   (b) sealing a cap to said wafer in predetermined areas of each chip by providing a strip of adhesive around the periphery of each chip, the cap having a thickness, an upper face, and a plurality of openings corresponding to said contact pads of said chips subjacent the cap, these openings being through-holes positioned to allow access to the corresponding contact pads;

(c) forming in the cap, on a portion of the cap thickness, a plurality of trenches along each subjacent chip, such that the plurality of openings emerges into said trenches;

(d) providing in the plurality of openings electrical connections conducting at the pads, said connections emerging on the upper face of the cap;

(e) flowing a coating resin into said plurality of openings and trenches;

(f) polishing and metallising the cap, and (g) cutting the wafer into a plurality of individual coated components.

8. The process of claim 7 wherein the sealing step further comprises providing an adhesive in a central area of each chip.

9. A process for producing coated components including electronic chips, from a wafer carrying a plurality of individual chips and from which will be formed, after cutting of the wafer, a corresponding plurality of components, the components being a CMS component of the CSP type, comprising:

(a) providing a wafer on which is formed a plurality of individual chips, each chip having at least one side and comprising a plurality of contact pads, said pads being laid out on at least one side of the chip;

(b) sealing a cap to said wafer in predetermined areas of each chip, the cap having a thickness, an upper face, and a plurality of openings corresponding to said contact pads of said chips subjacent the cap, these openings being through-holes positioned to allow access to the corresponding contact pads;

(c) forming in the cap, on a portion of the cap thickness, a plurality of trenches along each subjacent chip, such that the plurality of openings emerges into said trenches;

(d) providing in the plurality of openings electrical connections conducting at the pads, said connections emerging on the upper face of the cap, and forming a metalization in contact with the pads and extending on the sides from the openings and bottom and the sides from the trenches, said metalization being electrically isolated from the wafer and the cap;

(e) flowing a coating resin into said plurality of openings and trenches;

(f) polishing and metallising the cap, and (g) cutting the wafer into a plurality of individual coated components.

10. A process for producing coated components including electronic chips, from a wafer carrying a plurality of individual chips and from which will be formed, after cutting of the wafer, a corresponding plurality of components, the components being a CMS component of the CSP type, comprising:

(a) providing a wafer on which is formed a plurality of individual chips, each chip having at least one side and comprising a plurality of contact pads, said pads being laid out on at least one side of the chip;

(b) providing a single cap, the cap having a thickness, an upper face, and a plurality of openings corresponding to said contact pads of said chips subjacent the cap, these openings being through-holes positioned to allow access to the corresponding contact pads;

(c) forming in the cap, on a portion of the cap thickness, a plurality of trenches along each subjacent chip, such that the plurality of openings emerges into said trenches;

(d) providing in the plurality of openings electrical connections conducting at the pads, said connections emerging on the upper face of the cap;

(e) sealing said cap to said wafer in a predetermined area of said chips;

(f) flowing a coating resin into said plurality of openings and trenches;

(g) polishing and metallising the cap, and (h) cutting the wafer into a plurality of individual coated components.

11. An individual coated component made according to the process of claim 1.

12. An individual coated component made according to the process of claim 5.

13. An individual coated component made according to the process of claim 7.

14. An individual coated component made according to the process of claim 9.

15. An individual coated component made according to the process of claim 10.

* * * * *

UNITED STATES PATENT AND TRADEMARK OFFICE
CERTIFICATE OF CORRECTION

PATENT NO.   : 6,251,703 B1
DATED        : June 26, 2001
INVENTOR(S)  : Yves Van Campenhout et al.

It is certified that error appears in the above-identified patent and that said Letters Patent is hereby corrected as shown below:

Column 1,
Line 26, delete "pads beings" and insert -- pads being -- therefor;
Line 41, delete "permeate" and insert -- to permeate -- therefor;

Column 2,
Line 2, delete "are formed" and insert -- is formed -- therefor; and

Column 3,
Line 35, delete "referred to" and insert -- referred to as -- therefor.

Signed and Sealed this

Twenty-sixth Day of July, 2005

JON W. DUDAS
*Director of the United States Patent and Trademark Office*